United States Patent [19]
Kinugasa

[11] Patent Number: 5,289,057
[45] Date of Patent: Feb. 22, 1994

[54] LEVEL SHIFT CIRCUIT

[75] Inventor: Yasushi Kinugasa, Kyoto, Japan

[73] Assignee: Rohm Co., Ltd., Kyoto, Japan

[21] Appl. No.: 42

[22] Filed: Jan. 4, 1993

[51] Int. Cl.[5] ................. H03K 19/092; H03K 19/094
[52] U.S. Cl. .................................. 307/475; 307/448; 307/450
[58] Field of Search ............... 307/475, 451, 450, 448

[56] References Cited

U.S. PATENT DOCUMENTS

| 3,623,030 | 11/1971 | Sawyer | 307/299.1 |
| 3,740,582 | 6/1973 | McCusker et al. | 307/643 |
| 4,743,782 | 5/1988 | Nelson et al. | 307/475 |
| 5,068,550 | 11/1991 | Barre | 307/475 |
| 5,118,966 | 6/1992 | Kumada | 307/491 |

Primary Examiner—Edward P. Westin
Assistant Examiner—Richard Roseen
Attorney, Agent, or Firm—Nikaido, Marmelstein, Murray & Oram

[57] ABSTRACT

A level shift circuit composed of two terminals which are different in potential level, at least two capacitors each incorporating a ferroelectric material and connected to each other in series between the two terminals, and output terminals each provided on one side of each of the capacitors, so that the output terminals are capable of outputting respective signals which are different in direct-current voltage level.

6 Claims, 5 Drawing Sheets

LEVEL SHIFT CIRCUIT

BACKGROUND OF THE INVENTION

The present invention relates to a level shift circuit for use in a low power source coupled field effect transistor logic circuit (hereinafter referred to as "LSCFL"), buffered field effect transistor logic circuit (hereinafter referred to as "BFL"), emitter coupled logic circuit (hereinafter referred to as "ECL") or a like circuit. More particularly, it relates to a level shift circuit capable of reducing a power supply voltage and a current needed for an operation of a circuit incorporating this level shift circuit while outputting a desired direct-current voltage level (hereinafter referred to as "DC level").

A LSCFL is used in a variety of circuits because it can utilize a series gating means and operates at a high speed with a low power consumption. A conventional-type LSCFL is shown in FIG. 4 wherein a reference character P denotes a differential logic circuit section comprising an OR circuit formed by field effect transistors (FETs) $Q_{11}$ to $Q_{16}$ which are connected by using a three level series gate, and a reference character S denotes a level shift circuit section. In this LSCFL, output parts of the differential logic circuit section P are connected to the gates of FETs $Q_{17}$ and $Q_{18}$, respectively. The drains of these FETs are connected to a power supply terminal $V_s$ while on the other hand the sources thereof are serially connected respectively to diodes $D_{11}, D_{12}$ and diodes $D_{13}, D_{14}$ and grounded through FETs $Q_{20}$ and $Q_{21}$, respectively, which FETs $Q_{20}, Q_{21}$ generate a constant current.

With this LSCFL the differential logic circuit section P generates logic signals, which are then increased in capability of driving load by the level shift circuit section S. The level shift voltage are outputted to a next circuit (not shown) through output terminals $O_1$ to $O_4$ connected respectively to the terminals of the diodes $D_{11}$ to $D_{14}$. Thus, a logic circuit is formed as a whole. In this case, in order to obtain three DC levels, it is conceivable to obtain one DC level from output terminals A and B provided before the diodes $D_{11}$ and $D_{13}$, respectively. However, DC levels at output terminals A and B are almost the same as those of the gate electrodes of the FETs $Q_{17}$ and $Q_{18}$, respectively. Hence, the respective DC levels of the terminals A and B are instable due to current to voltage characteristic (hereinafter referred to as I-V characteristic) of a FET, like a I-V characteristic in rise of a triode. This results in a difficulty of obtaining a DC level which assures a stable operation of the circuit.

There has been introduced a level shift circuit which can reduce the series voltage of the level shift circuit section S governing the power supply voltage so as to operate a LSCFL with a low power supply voltage, in "Level Shift Circuits for GaAs Low Power Source Coupled FET Logic", The Transactions of the IEICE, VOL. E 70, NO. 4 April 1987, pages 224 to 226. This circuit is shown in FIG. 5 wherein FETs $Q_{31}$ to $Q_{34}$ are used instead of the diodes $D_{11}$ to $D_{14}$ in the level shift circuit section S, and the FETs $Q_{31}$ and $Q_{32}$ as well as the FETs $Q_{33}$ and $Q_{34}$ are connected to each other in series with respective gate which is connected with drain. In the level shift circuit, each diode conventionally requires a level shift voltage of about 0.7 V, while the introduced level shift circuit can provide the same current intensity as with the conventional one, with each FET requiring a level shift voltage of only about 0.4 V. As a result, the power supply voltage needed for the introduced level shift circuit is less than that for the conventional one by 1.8 V, or by 30% in total.

The LSCFL, despite its large power consumption, is employed in various circuits in view of its wide applicability to devices which are different in electric characteristics. With the recent trend of compact and lightening electronic devices, however, the LSCFL is being required to operate at a low supply voltage.

In this respect, with the conventional level shift circuit using diodes it is difficult to reduce power supply voltage and operating current since current always needs to flow in the circuit. Further, since a saturation voltage for each diode cannot be reduced to less than 0.7 V without the loss of operation speed, the power supply voltage in total cannot be reduced because of serial connection of diodes though this circuit can cause other circuit associated with the LSCFL to operate at a relatively low voltage. In addition, there is another problem that the amount of level-shifting cannot be set to a desired value because it depends on the semiconductor material used for each diode and, hence, cannot be varied.

With the above-mentioned level shift circuit using FETs in which the respective gates are short-circuited with drains, current always needs to flow in the circuit as with the above circuit using diodes. Although this circuit can substantially reduce the power supply voltage, the voltage-current relation in this circuit is instable due to variation in characteristics of the FETs, particularly static characteristics such as threshold voltage $V_{th}$ and current amplification factor since a FET operation is similar to a triode operation in rise in a transient state. This results in a substantial instability in a level-shifting amount of output at each unit level shift circuit, resulting in a problem of extremely poor controllability in level shift voltage.

The present invention has been attained in view of the foregoing circumstances. Thus, it is an object of the present invention to provide a novel level shift circuit capable of obtaining a stable level-shifting amount while operating at a low power supply voltage.

SUMMARY OF THE INVENTION

According to the present invention, there is provided a level shift circuit comprising two terminals which are different in potential level, at least two capacitors each incorporating a ferroelectric material and connected to each other in series between the two terminals, and output terminals each provided on one side of each of the capacitors, whereby the output terminals are capable of outputting respective signals which are different in direct-current voltage level.

According to the present invention there is also provided a level shift circuit comprising at least two capacitors each incorporating a ferroelectric material and connected to a source of a field effect transistor in series wherein drain is connected to a power supply terminal, output terminals each provided on one side of each of the capacitors, whereby the output terminals are capable of outputting respective signals which are different in direct-current voltage level.

According to the present invention, there is also provided a level shift circuit comprising at least two capacitors each incorporating a ferroelectric material and connected to each other in series in such a manner that the source follower of a field effect transistor connected to an output terminal of a differential logic circuit which varies a current value depending on whether an input voltage is higher or lower than a reference voltage, whereby output signals which are different in direct-current voltage level are generated.

In the present invention the ferroelectric material forming the capacitors is preferably barium titanate, strontium titanate, and lead zirconate titanate (hereinafter referred to as "PZT").

With the present invention, at least two capacitors each incorporating a ferroelectric material are connected to each other in series between two terminals which are different in potential level. Hence, level shifting can be achieved utilizing electric charge retained by residual dielectric polarization in the capacitors. Further, since a level shift voltage can be freely set if a capacitor area, and material and thickness of a ferroelectric film are appropriately selected, a desired level shift voltage can be obtained at a low voltage, hence reducing the power supply voltage. In addition, current does not flow so far as the capacitors are charged, accordingly, there is no need to make current always flow, hence lowering the operating current.

DETAILED DESCRIPTION

Now, the present invention will be described in detail with reference to the drawings.

Figure 1:
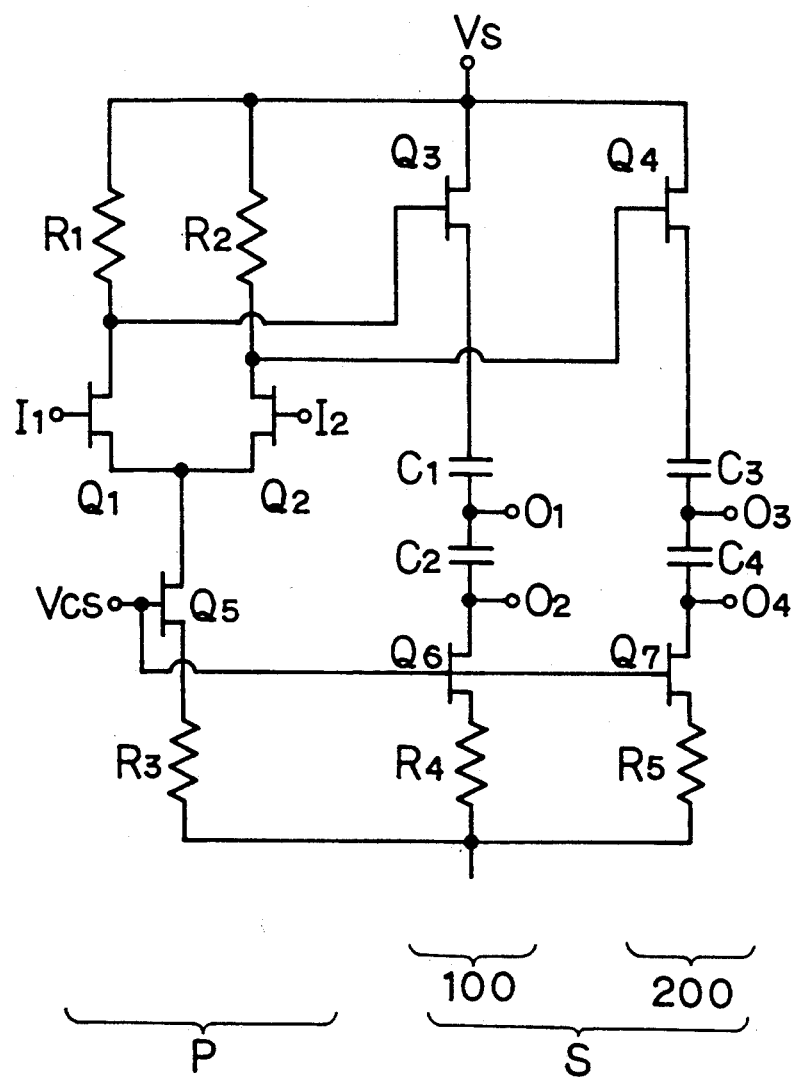
FIG. 1 is a circuit diagram showing a level shift circuit as an embodiment of the present invention which is connected to a basic differential logic circuit.

FIG. 1 is a circuit diagram wherein a level shift circuit section S embodying the present invention is connected to a most basic differential logic circuit section P. In FIG. 1, reference characters $Q_1$ to $Q_7$ denote FETs, $C_1$ to $C_4$ denote capacitors, $R_1$ to $R_5$ denote resistors, $I_1$ and $I_2$ denote input terminals, $O_1$ to $O_4$ denote output terminals, $V_s$ denotes a power supply terminal, and $V_{cs}$ denotes an input terminal for controlling constant current source. In this circuit, the two identical FETs, $Q_1$ and $Q_2$ are connected to each other symmetrically on the source side thereof. The FET $Q_5$ and the resistor $R_3$, which form a constant current circuit, allow constant current to flow. Accordingly, complementary signals inputted respectively to the input terminals $I_1$ and $I_2$ cause a current to change, so that logic signals are fed to respective gate electrodes of the source follower FETs, $Q_3$ and $Q_4$, which serve to drive a next circuit (not shown). In the differential logic circuit section P, if there is a current fluctuation due to a change in temperature or the like or a power supply voltage fluctuation, there are identical fluctuations in both of the FETs $Q_1$ and $Q_2$, so that they are complemented by each other. Further, source current can be supplied stably in the section P, so that a bias current stability is excellent. For this reason, this form or system is employed as a basic circuit in various circuits such as an IC operational amplifier.

This differential logic circuit section P can use two identical transistors instead of the FETs. Otherwise, the section P can comprise a plural series of pairs of such transistors or FETs so as to form an OR-NOR circuit to which three or more signals are inputted.

In the level shift circuit section S, outputs of the differential logic circuit section P, which are of negative phase sequence with respect to each other, are fed to the gates of the FETs, $Q_3$ and $Q_4$, respectively. The respective sources of these FETs are connected to the two level shift in series, respectively so as to drive the next circuit (not shown). More specifically, the source of the FET $Q_3$ is connected to a circuit 100 wherein the capacitors $C_1$ and $C_2$, a the constant current circuit comprising a FET $Q_6$, and a resistor $R_4$ are serially connected. Similarly, the source of the FET $Q_4$ is connected to a circuit 200 identical with the circuit 100. Thus, the level shift circuit section S is adapted to output different DC level signals, the signals on each level being of negative phase sequence with respect to each other. Here, the FETs $Q_5$ to $Q_7$ serve to make current from the constant current source into constant current; and the resistors $R_3$ to $R_5$ serve as compensating resistors which compensate for different current due to different operations of the components. These FETs and resistors can be replaced with respective alternatives so far as constant current can be obtained.

In the capacitors $C_1$ to $C_4$ is used a ferroelectric material such as barium titanate, strontium titanate or PZT of which the relative dielectric constant is preferably more than 100. Use of a ferroelectric material having a large relative dielectric constant generates residual dielectric polarization and makes it possible to utilize a potential retained by residual dielectric polarization as an output. The potential is retained even if the power source is turned OFF. Further, a ferroelectric material having a relative dielectric constant larger than that of another one has a larger capacitance C per unit area. Larger capacitance C desirably brings a larger amount of electric charge Q at a low voltage V, as represented by the equation: $Q = CV$.

When voltage is applied to the circuit 100 which is connected to the source of the driving FET $Q_3$, voltages at the capacitors $C_1$ and $C_2$ are reduced by $V_{c1}$ and $V_{c2}$, respectively because of electric charge retained by residual dielectric polarization. As a result, the output terminals $O_1$ and $O_2$ output signals which are shifted in DC level to $V_s - V_{c1}$, and $V_s - V_{c1} - V_{c2}$, respectively where $V_s$ represents a power supply voltage, and supply them to the next circuit. Similarly, the counterpart signals from the FET $Q_2$ of the differential logic circuit section P which are of negative phase sequence with respect to the formers are also level-shifted at the capacitors $C_3$ and $C_4$ of which voltages are reduced by $V_{c3}$ and $V_{c4}$, respectively. As a result, the output terminals $O_3$ and $O_4$ output signals which are shifted in DC level to respective values and supply them to the next circuit.

Level shift voltage at the capacitors $C_1$ to $C_4$ can be set freely within the range of from a few mV to a voltage near the power supply voltage by changing the ferroelectric material or varying the area or thickness of the ferroelectric material layer. Moreover, current will not flow so far as electric charge is retained by residual dielectric polarization and, hence there is a great reduction in power consumption. In addition, there is no need to recharge the capacitors because the potentials retained by residual dielectric polarization are utilized. Practically, a capacitor was formed using PZT as the ferroelectric material, of which the relative dielectric constant was 100, with the film thickenss and capacitor area set to 100 μm, and $1\times10^{-4}$ mm$^2$, repsectively. The capacitor thus formed was level-shifted by 0.8 V.

If the number of output levels needs to be increased in spite of a high power supply voltage, three or more output levels can be obtained by serially connecting a necessary number of capacitors after the capacitors $C_2$ and $C_4$.

The above-mentioned capacitor using a ferroelectric material can be formed in, for example, the following manner.

Figure 3A:
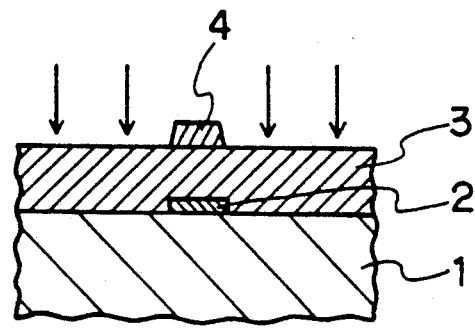
FIG. 3(a), 3(b) and 3(c) are an explanatory views illustrating a manufacturing process for a capacitor used in a level shift circuit embodying the present invention.

As shown in FIG. 3(a), on a semiconductor substrate 1 formed with an integrated circuit is deposited a metal such as gold or aluminum to about 0.3 to 0.5 μm thick by sputtering or vapor deposition. Unnecessary portions of the deposited metal film are then removed by etching to form a lower electrode 2. In turn, a ferroelectric layer 3 comprising barium titanate, strontium titanate or the like is formed to about to 1 to 100 μm thick on the substrate surface by sol-gel method or sputtering. A resist film 4 is formed on the ferroelectric layer 3 existing just above the lower electrode 2, and then the ferroelectric layer 3 is subjected to etching using an etching agent composed of hydrogen fluoride, or hydrogen fluoride and hydrochloric acid, or hydrogen fluoride, hydrogen peroxide and water so as to retain the ferroelectric layer 3 present only above the lower electrode 2 while removing unnecessary portions thereof.

Figure 3B:
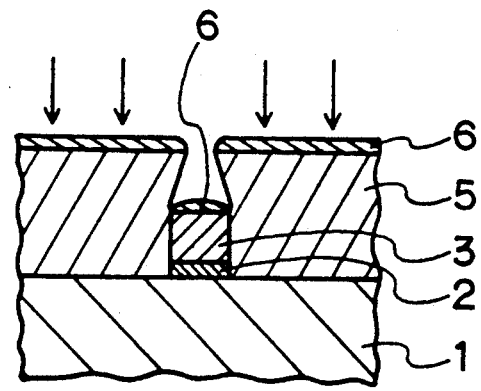

Next, as shown in FIG. 3(b), a resist film 5 of the negative type is applied on the entire substrate surface, and then a recess is formed extending from the surface of the resist film 5 down to the ferroelectric layer 3. In turn, a metal film 6 such as of gold or aluminum is deposited on the substrate surface by sputtering or a like technique.

Figure 3C:
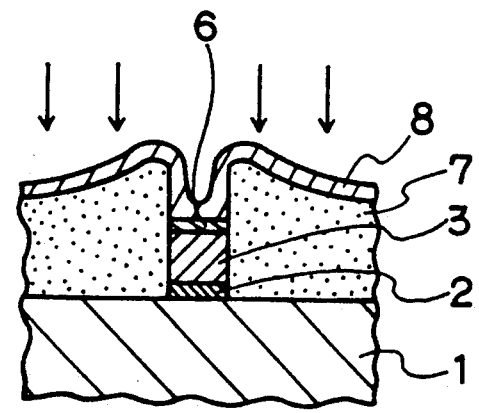
Figure 4:
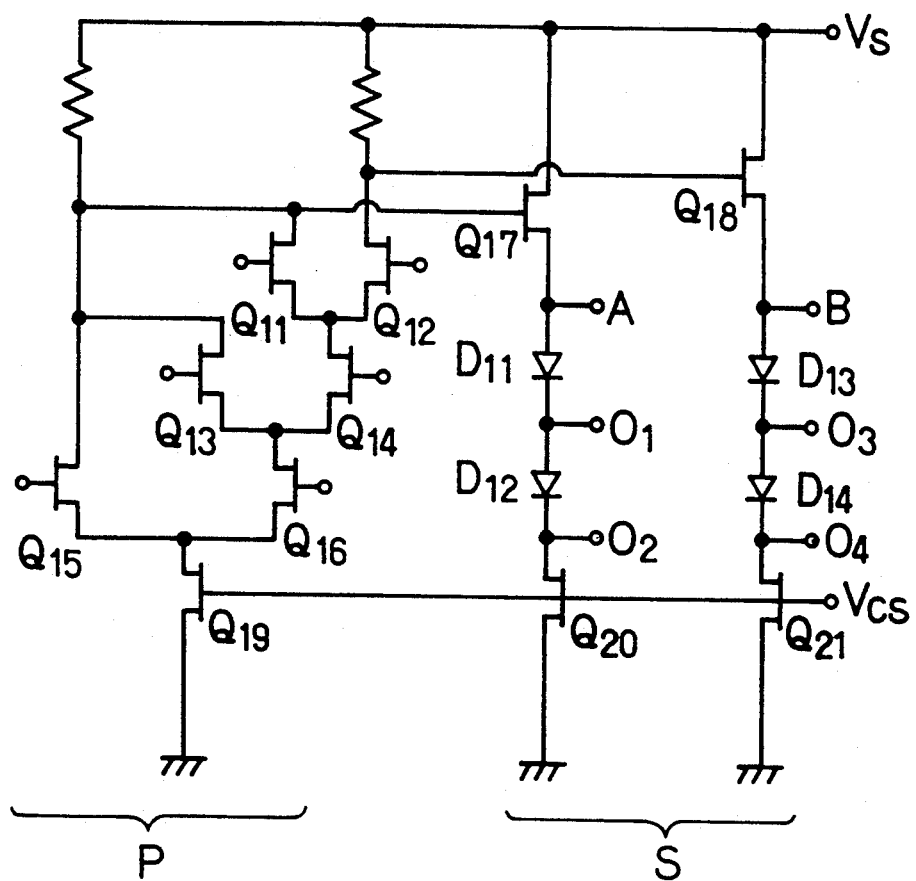
FIG. 4 is a circuit diagram showing an example of a conventional level shift circuit.
Figure 5:
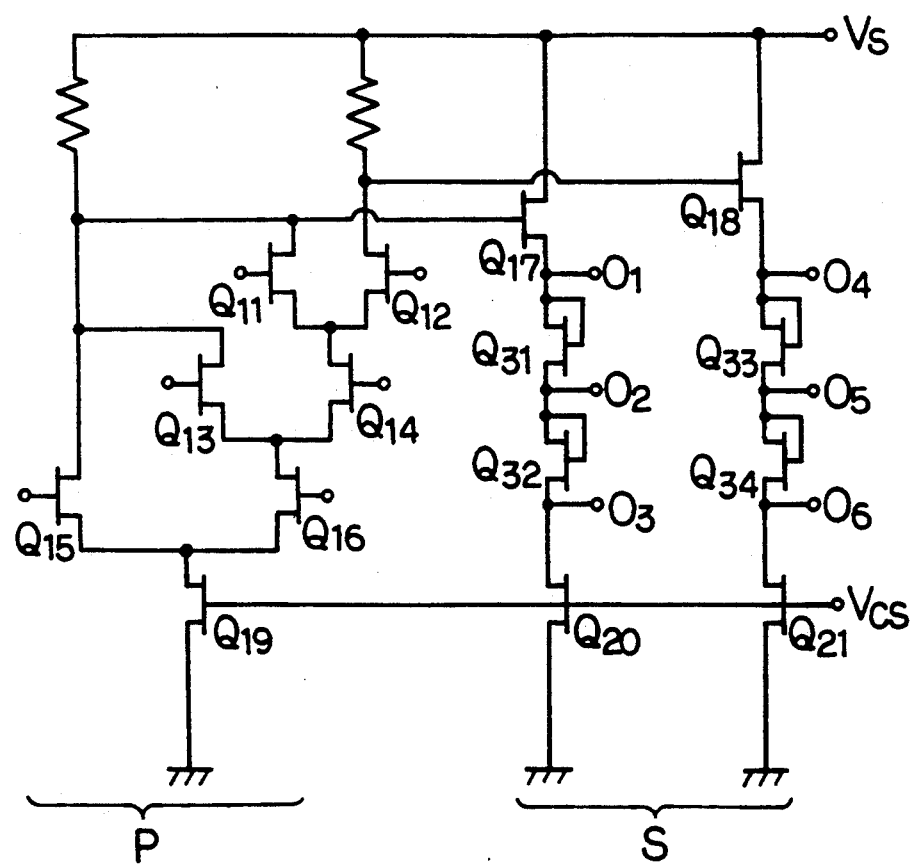
FIG. 5 is a circuit diagram showing another example of a conventional level shift circuit.

Finally, as shown in FIG. 3(c), the resist film 5 around the ferroelectric layer 3 is removed together with the metal film present thereon. As a result, the metal film 6 is retained only on the ferroelectric layer 3 to form an upper electrode. Thus, a capacitor is completed. Thereafter, the entire substrate surface is covered with a passivation film 7 such as of SiON or SiN, followed by providing wiring by a known technique. Specifically, wiring is provided by forming a contact hole extending through the passivation film 7 down to the upper electrode 6 and then forming a thin metal film in the contact hole and on the passivation film 7. Thus, electrical interconnection with other devices is achieved.

EXAMPLE 1

Figure 2:
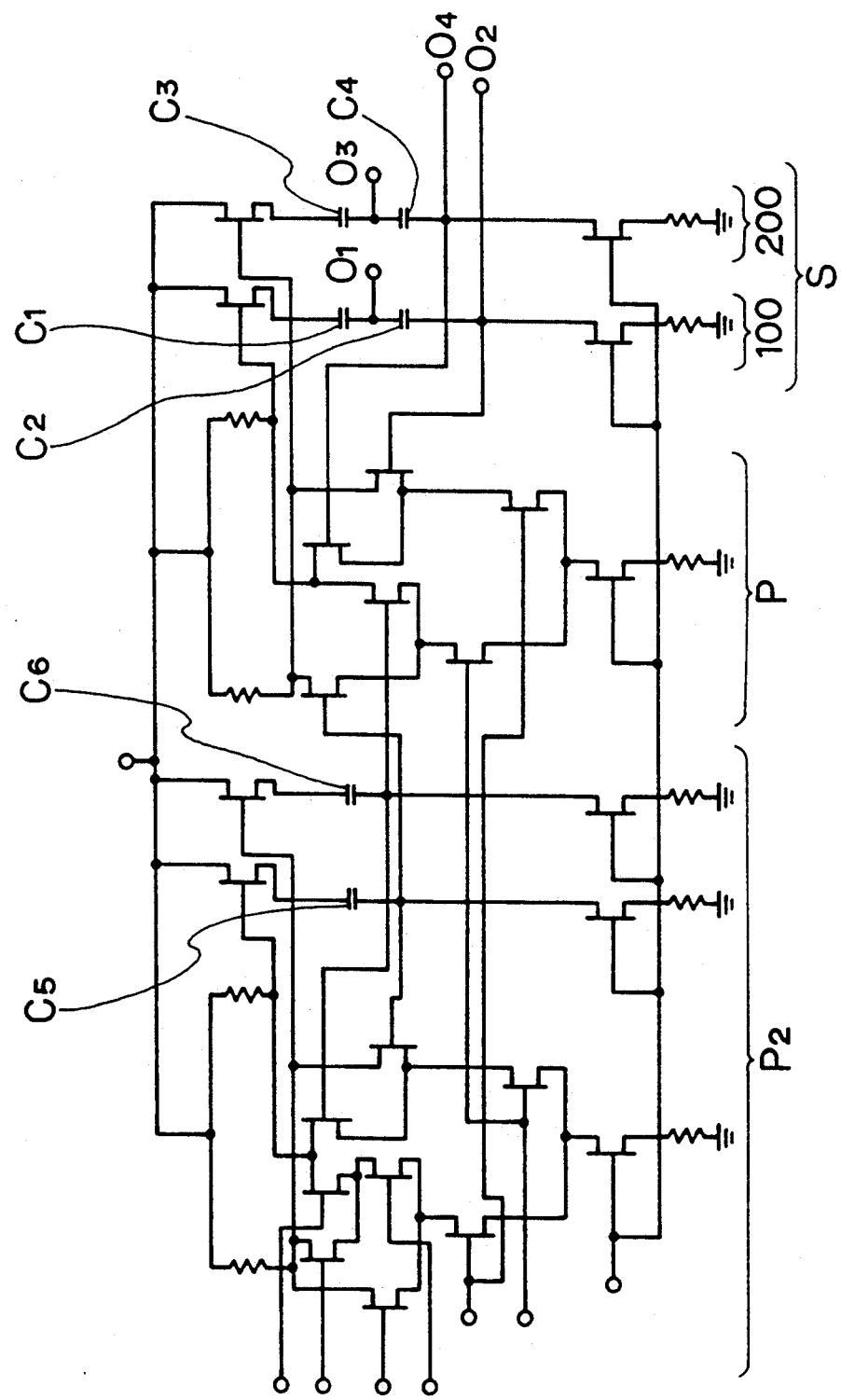
FIG. 2 is a circuit diagram showing a D-type flip flop circuit in which a level shift circuit embodying the present invention is employed.

FIG. 2 is a circuit diagram showing a D-type flip flop circuit in which a level shift circuit embodying the present invention is connected to a differential logic circuit. In FIG. 2, a reference character P denotes a differential logic circuit section, and a reference character S denotes a level shift circuit section in which two series of a pair of capacitors are serially connected to two source follower FETs, respectively, like the circuit in FIG. 1.

The circuit shown in FIG. 2 forms a master-slave type flip flop circuit wherein output signals shifted in DC level at the first stage comprising capacitors $C_1$ and $C_3$ in the level shift circuit section S are adapted to be fed back to a second differential logic circuit section $P_2$, while output signals shifted to a second DC level at the second stage comprising capacitors $C_2$ and $C_4$ are adapted to be fed through output terminals $O_2$ and $O_4$ to a next circuit (not shown) such as AND-NAND circuit, OR-NOR circuit, or another flip flop circuit.

The flip flop circuit using the level shift circuit embodying the present invention operates at a power supply voltage of about 2.5 V, and is applicable to a system using a power supply voltage of about 3 V. In contrast a flip flop circuit of the same type but using a conventional level shift circuit cannot operate at a power supply voltage of lower than 3.5 V, and is not applicable to a system using a power supply voltage of lower than 5 V. In addition, with the level shift circuit of the present invention even when current does not flow through the level shift circuit section S, a level shift voltage of about 0.4 V, which is needed for the operation of this flip flop circuit, can be obtained by virtue of residual dielectric polarization exhibited by the capacitors. It should be noted that capacitors $C_5$ and $C_6$ are provided in the differential logic circuit section $P_2$ for retaining data of the master circuit part and level-shifting to a certain DC level allowing stable output of data to the slave circuit part.

As has been described, according to the present invention series of capacitors each incorporating a ferroelectric material are used in a level shift circuit to achieve a level shifting operation. Accordingly, the level shift circuit of the present invention can operate at a voltage lower than that for a conventional level shift circuit using series of diodes as a level shifting part. Further, electric charge retained by residual dielectric polarization exhibited by the capacitors is utilized when little current flows through the level shift circuit, so that a plurality of DC levels can be stably obtained. In addition, the amount of electric charge stored in each capacitor can be set freely by varying the capacitor area or the thickness of the ferroelectric film, or changing the ferroelectric material to another one.

As a result, the level shift circuit of the present invention can be applied to a wide range of circuits such as flip flop circuits, LSCFLs, BFLs, ECLs, multiplication circuits, and adder circuits. In addition, the circuit can operate at a lower power supply voltage and a low current; hence, it can effectively be applied to circuits for mobile communications.

Though several embodiments of the present invention are described above, it is to be understood that the present invention is not limited only to the above-mentioned, various changes and modifications may be made in the invention without departing from the spirit and scope thereof.

What is claimed is:

1. A level shift circuit comprising two terminals which are different in potential level, at least two capacitors each incorporating a ferroelectric material and connected to each other in series between the two terminals, and output terminals each provided on one side of each of the capacitors, whereby the output terminals are capable of outputting respective signals which are different in direct-current voltage level.

2. A level shift circuit comprising at least two capacitors each incorporating a ferroelectric material and connected to a source of a field effect transistor in series wherein drain is connected to a power supply terminal, output terminals each provided on one side of each of the capacitors, whereby the output terminals are capable of outputting respective signals which are different in direct-current voltage level.

3. A level shift circuit comprising at least two capacitors each incorporating a ferroelectric material and connected to each other in series, and a field effect transistor with a source connected to one of said at least two capacitors, and a gate of said FET connected to an output terminal of a differential logic circuit which varies a current value depending on whether an input voltage is higher or lower than a reference voltage, wherein output signals at said at least two capacitors are different in direct-current voltage level.

4. The level shift circuit as set forth in claim 1, wherein said ferroelectric material incorporated in the capacitors is barium titanate.

5. The level shift circuit as set forth in claim 1, wherein said ferroelectric material is strontium titanate.

6. The level shift circuit as set forth in claim 1, wherein said ferroelectric material is lead zirconate titanate.

* * * * *